US010292305B2

(12) United States Patent
Greubel et al.

(10) Patent No.: US 10,292,305 B2
(45) Date of Patent: May 14, 2019

(54) HAZARDOUS LOCATION COOLING SYSTEM AND METHOD FOR USE THEREOF

(71) Applicant: Ice Qube, Inc., Greensburg, PA (US)

(72) Inventors: Justin Greubel, Greensburg, PA (US); Adam Tokarski, Greensburg, PA (US)

(73) Assignee: Ice Qube, Inc., Greensburg, PA (US)

( * ) Notice: Subject to any disclaimer, the term of this patent is extended or adjusted under 35 U.S.C. 154(b) by 0 days.

(21) Appl. No.: 16/071,061

(22) PCT Filed: Jan. 12, 2018

(86) PCT No.: PCT/US2018/013442
§ 371 (c)(1),
(2) Date: Jul. 18, 2018

(87) PCT Pub. No.: WO2018/132634
PCT Pub. Date: Jul. 19, 2018

(65) Prior Publication Data
US 2019/0053399 A1    Feb. 14, 2019

Related U.S. Application Data

(60) Provisional application No. 62/446,041, filed on Jan. 13, 2017.

(51) Int. Cl.
*H05K 7/20* (2006.01)
*F24F 1/027* (2019.01)
(Continued)

(52) U.S. Cl.
CPC .............. *H05K 7/202* (2013.01); *F24F 1/027* (2013.01); *F24F 3/1603* (2013.01);
(Continued)

(58) Field of Classification Search
CPC .............. H05K 7/206; H05K 7/20609; H05K 7/20754; H05K 7/202; F24F 3/1603;
(Continued)

(56) References Cited

U.S. PATENT DOCUMENTS 2,914,927 A * 12/1959 Corhanidis ............. F25D 19/00
62/237
5,035,281 A * 7/1991 Neuenfeldt ......... F28D 15/0266
165/104.14
(Continued)

FOREIGN PATENT DOCUMENTS

WO    WO-2015061527 A1 *    4/2015 .............. B23P 19/04
WO    WO2015061527 A1       4/2015

*Primary Examiner* — Zachary Pape
(74) *Attorney, Agent, or Firm* — Cafardi, Ferguson, Wyrick, Weis and Stotler LLC; Andrew M. Gabriel (57) ABSTRACT

An embodiment includes a cooling unit, including: a housing configured to attach to an enclosure opening in a sealed manner, where the enclosure houses heat generating electrical equipment; the housing including: a first ambient side area including a compressor, condensing coils, and an ambient air intake and outlet; a first enclosure side area situated above the first ambient side area and including an electrical box that includes one or more relays and a digital controller; a second enclosure side area extending along the rear side of the housing and communicating with the first enclosure side area, including an impeller, an enclosure air intake, an enclosure air return, and evaporator coils in fluid communication with the condenser coils; and a second ambient side area including an impeller and one or more hot air exhausts; where all components of the cooling unit are non-sparking and non-arcing; and where the first and second ambient side areas are sealed off from the first and second enclosure side areas. Other embodiments are described and claimed.

12 Claims, 6 Drawing Sheets

(51) Int. Cl.
  *F24F 13/22* (2006.01)
  *F24F 3/16* (2006.01)
(52) U.S. Cl.
  CPC ............ *F24F 13/222* (2013.01); *H05K 7/206* (2013.01); *H05K 7/20609* (2013.01)
(58) Field of Classification Search
  CPC .. F24F 13/222; F24F 1/027; F24F 1/02; F24F 1/022
  See application file for complete search history.

(56) References Cited

U.S. PATENT DOCUMENTS

| | | | | |
|---|---|---|---|---|
| 5,036,677 | A * | 8/1991 | Neuenfeldt | F25D 19/00 62/259.1 |
| 5,657,641 | A | 8/1997 | Cunningham | |
| 5,738,166 | A * | 4/1998 | Chou | F28D 15/0266 165/104.21 |
| 9,157,670 | B2 * | 10/2015 | Kreeley | B23P 19/04 |
| 2006/0243423 | A1 * | 11/2006 | Giacoma | F28D 9/00 165/104.14 |
| 2013/0292088 | A1 | 9/2013 | Koivuluoma | |
| 2018/0132379 | A1 * | 5/2018 | Cacho Alonso | H05K 7/206 |

* cited by examiner

HAZARDOUS LOCATION COOLING SYSTEM AND METHOD FOR USE THEREOF

CROSS REFERENCE TO RELATED APPLICATIONS

This application claims priority to U.S. provisional patent application Ser. No. 62/446,041, filed on Jan. 13, 2017 and entitled "Hazardous Location Cooling System and Method for Use Thereof," the contents of which are incorporated by reference herein.

FIELD

The subject matter disclosed herein relates to closed-loop enclosure cooling systems and related techniques. Some of the subject matter disclosed herein relates to closed-loop cooling systems mounted to another enclosure and used for cooling electronics within the enclosure within a hazardous environment.

BACKGROUND

Closed-loop enclosure cooling systems (air conditioners) are specifically designed to mount on to electronic enclosures, e.g., a cabinet that contains heat generating electronic components, and remove heat without letting outside air into the sealed enclosure. This type of cooling is typically used to cool electronic equipment housed inside a National Electrical Manufacturers Association (NEMA) rated enclosure, which protects sensitive electronics from dust, splashing liquids and production residues. Such enclosures are used in a variety of industries, including telecommunication, industrial automation, oil and gas production, pharmaceutical, food and beverage, and wastewater.

In a closed-loop system, the heated enclosure air is drawn into the air conditioner. Heat and moisture are removed as the heated enclosure air passes through an evaporator coil. The conditioned air is forced back into the enclosure. In a closed-loop system, the integrity of the enclosure is maintained.

BRIEF SUMMARY

In summary, one embodiment provides a cooling unit, comprising: a housing configured to attach to an enclosure opening in a sealed manner, where the enclosure houses heat generating electrical equipment. The housing comprises: a first ambient side area including a compressor, condensing coils, and an ambient air intake and outlet. The housing further includes a first enclosure side area situated above the first ambient side area. The first enclosure side area includes an electrical box that includes one or more relays and a digital controller. In an embodiment, all components of the electrical box are non-sparking and non-arcing, and do not require purging of hazardous air.

In an embodiment, the housing further includes a second enclosure side area extending along the rear side of the housing and communicating with the first enclosure side area. The second enclosure side area includes an impeller, an enclosure air intake, an enclosure air exhaust, and evaporator coils in fluid communication with the condensing coils.

In an embodiment, the housing further includes a second ambient side area, which includes an impeller and one or more hot air exhausts. The first and second ambient side areas are sealed off from the first and second enclosure side areas.

In an embodiment, all components of the cooling unit are non-sparking and non-arcing, and are acceptable for use in a hazardous environment. The components do not require purging of hazardous air. In an embodiment, one or more of the components of the electrical box are made safe for hazardous environment use via sealing, e.g., with an epoxy, use of solid state devices, or are nonincendive components.

In an embodiment, the first enclosure side area comprises a first plate onto which one or more components of the electrical box are adhered or attached, and the first plate sits atop a second plate that seals the first enclosure side area off from the first ambient side area. In an embodiment, the first and second plates define an air gap into which enclosure air circulates, cooling one or more components of the electrical box. The first plate may include a heat sink to manage heat, e.g., generated by components of the electrical box.

In an embodiment, the electrical box includes power and data connections, e.g., an ethernet connection. These power and data connections may be used to remotely monitor or control the air conditioner, e.g., report on an alarm condition, respond to remote commands to adjust settings, etc.

In an embodiment, a connection is provided for fitting to a purge system of the enclosure. An embodiment comprises a purge tube extending from the fitting and terminating within the first enclosure side area.

In embodiment, the housing is about 9.5 to about 17.75 inches in width.

In an embodiment, a filter is positioned to filter air that transits through the ambient air intake.

In an embodiment, the second ambient side area comprises three hot air exhausts positioned on the front, left and right sides of a rectangular housing. A diverter plate attaches to any of the three hot air exhausts. More than one diverter plate may be provided and attached to more than one of the hot air exhausts.

In an embodiment, a digital controller is disposed within a rear, enclosure facing surface of the rectangular housing. The digital controller is nonincendive and may be exposed to hazardous air. In an embodiment, the digital controller may be located elsewhere, e.g., on a front, ambient side of the air conditioner.

In an embodiment, the second enclosure side area comprises a water drain therein. The water drain is disposed in a bottom plate of a drain pan of the rectangular housing. A ball and drain tube form an assembly, and are included so that the drain tube is situated at the drain.

An embodiment provides a method of installing a closed loop cooling unit to an enclosure for hazardous location cooling. In an embodiment, the method includes attaching the cooling unit to the enclosure such that an enclosure side of the cooling unit conducts heated air from the enclosure over cooling coils disposed within an elongated, rear enclosure side area of the cooling unit, which faces the enclosure. The attaching step includes arranging an enclosure air intake and return of a rear face of the elongated, rear enclosure side area to conduct heated air from the enclosure over the cooling coils. The cooling unit can then be operated to conduct heated air from the enclosure over components of an electric box of an upper enclosure side area of the cooling unit having non-sparking, non-arcing components disposed therein. All ambient side areas of the cooling unit are segregated from the elongated, rear enclosure side area and the upper enclosure side area of the cooling unit.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

BRIEF DESCRIPTION OF THE DRAWINGS

FIG. 1(A-B) illustrates an example closed-loop enclosure cooling system according to an embodiment.

FIG. 4(A-D) illustrates an example closed-loop enclosure cooling unit according to an embodiment.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the claims, but is merely representative of those embodiments.

Reference throughout this specification to "embodiment(s)" (or the like) means that a particular feature, structure, or characteristic described in connection with the embodiment is included in at least one embodiment. Thus, appearances of the phrases "according to embodiments" or "in an embodiment" (or the like) in various places throughout this specification are not necessarily all referring to the same embodiment.

Furthermore, the described features, structures, or characteristics may be combined in any suitable manner in one or more embodiments. In the following description, numerous specific details are provided to give a thorough understanding of example embodiments. One skilled in the relevant art will recognize, however, that aspects can be practiced without one or more of the specific details, or with other methods, components, materials, etc. In other instances, well-known structures, materials, or operations are not shown or described in detail to avoid obfuscation.

In this detailed description, an "area" and a "compartment" are used interchangeably, unless specifically indicated otherwise.

In an embodiment, all components of the air conditioner are non-sparking and non-arcing, e.g., formed of nonincendive components, solid state components, or sealed components. Therefore, the entire unit is capable of use in a hazardous location.

The present disclosure provides a cooling system and method for use that is designed for use in hazardous locations. In particular, an embodiment of the present disclosure is designed for use in hazardous locations classified as Class I, Division 2, Groups A, B, C, & D and may be embodied, at least in part, commercially as part of the Evolution Series™ of products offered by ICE QUBE, INC. of Greensburg, Pa., USA. In an embodiment, a cooling system is designed for use in locations classified as Zone 2, IIC rated (ATEX IECEx Zone 2). In an embodiment, the cooling system comprises a closed-loop circulation design that protects equipment from air-borne dust and contaminants, which may hinder a customer's other equipment operations and cause unnecessary downtime. Various embodiments may be configured in different sizes, power configurations, and BTU capacities to provide air conditioning systems suitable for various needs. Embodiments may be designed as enclosure top or side mount packages. A side mount cooling unit is illustrated and described by way of example; however, this is a non-limiting example. Any directional terms (e.g., upper, rear, etc.) may be easily translated to the appropriate term given the nature of the implementation.

In addition, despite the fact that embodiments of the present disclosure are described in connection with use in hazardous locations, there is no reason that any of the embodiments could not also be used as a general-purpose cooling system. Such a design provides for customer flexibility when using the cooling system in various types of locations.

An embodiment overcomes the limitations of the prior art by utilizing all non-sparking, non-arcing component parts, which may include encapsulated, solid-state, nonincendive, and/or hermetically sealed component parts. These methods of protection render the resultant components incapable of releasing enough electrical or thermal energy to ignite any hazardous gases, vapors, or liquids that may be found in the environment where the cooling system is operating. An embodiment therefore does not contain any ignition sources and is nonincendive, as that term is commonly understood in the art. As a result, the nonincendive system does not need to be used with a purge system when mounted to an enclosure having potentially hazardous enclosure side air, which is a traditional mechanism for protecting ignition source components in cooling systems used in hazardous locations.

Some of the other novel features of the cooling device described herein include a compact design to fit on smaller cabinets or enclosures. In one embodiment, an 11" (inch) narrow mounting width is provided. However, other sizes are possible for a cooling device according to various embodiments. For example, in one embodiment the air conditioner housing is about 20.06" in height, about 9.85" in width, and about 11.00" in depth. In another embodiment, the air conditioner housing is about 28.58" in height, about 11.31" in width, and about 14.15" in depth. In yet another embodiment, the air conditioner housing is about 38.58" in height, about 11.31" in width, and about 14.15" in depth. In a further embodiment, the air conditioning housing is about 44" in height, about 18" in width, and about 20" in depth.

A multi-directional condenser air discharge, which is adjustable in at least four different configurations, is provided. A digital controller with programmable temperatures, which can be installed either on the front or rear of the system, is provided. In one embodiment, the digital controller is located within a hazardous location electrical box of the cooling system. In an embodiment, an alarm is provided and can be configured to alert a user when the temperature of component(s) is/are above or below certain set limit(s), when the cooling system has been turned off, or when the cooling system malfunctions or operates at a predetermined level or condition.

An embodiment comprises a combination of systems that function simultaneously to maintain environmentally friendly conditions for equipment within the enclosure. The major thermal related systems comprise a closed-loop cold air supply stream, a heat rejection air stream, and a vapor-compression refrigeration system. In an embodiment, the cooling system itself may be further divided into an evaporator compartment (housing component parts configured to remove heat from the enclosure), a condenser compartment (housing component parts configured to compress refrigerant gas and vapor for return to the evaporator compartment), and an electrical box housing the electronic components that control the cooling system.

In an embodiment, the vapor-compression refrigeration system comprises a quiet, energy efficient rotary compressor configured to circulate environmentally friendly NON-CFC refrigerant. A purpose of this compressor is to transfer heat laden refrigerant from the evaporator, located within the closed-loop cool air system (the evaporator compartment), to a condenser, located in the warm air system (the condenser compartment). In the warm air system, air is circulated from the ambient surrounding the enclosure housing the cooling system, through a filter, and across the warm air system heat exchanger.

In one embodiment, a recessed pull-out filter may be used to filter ambient air as it enters the system. The filter does not require a separate filter holder. Such a configuration enables the filter to be removed without the use of tools. Heat from the enclosure is transferred from the warm air heat exchanger into the warm air stream and dissipated to the ambient air.

The enclosure air that is drawn into the cooling system brings with it unwanted heat and humidity from inside the enclosure. Heat and humidity is then removed by a heat exchanger (evaporator) located within the evaporator compartment of the cooling system. This heat exchanger is part of the vapor-compression refrigeration system.

In one embodiment, a heat exchanger of the present disclosure may be configured to have only two moving parts. These parts may comprise one or more maintenance-free impellers or blowers, which are used to move air over the heat exchanger coil. An enclosure impeller moves hot air from the top of enclosure, through the heat exchanger coil where the heat is dissipated and the cool air returns to the bottom of the enclosure. An ambient impeller moves air through a coil where the heat from the enclosure is absorbed and dissipated to the ambient air.

The description now turns to the figures. The illustrated example embodiments will be best understood by reference to the figures. The following description is intended only by way of example and simply illustrates certain selected example embodiments.

Figure 1A:
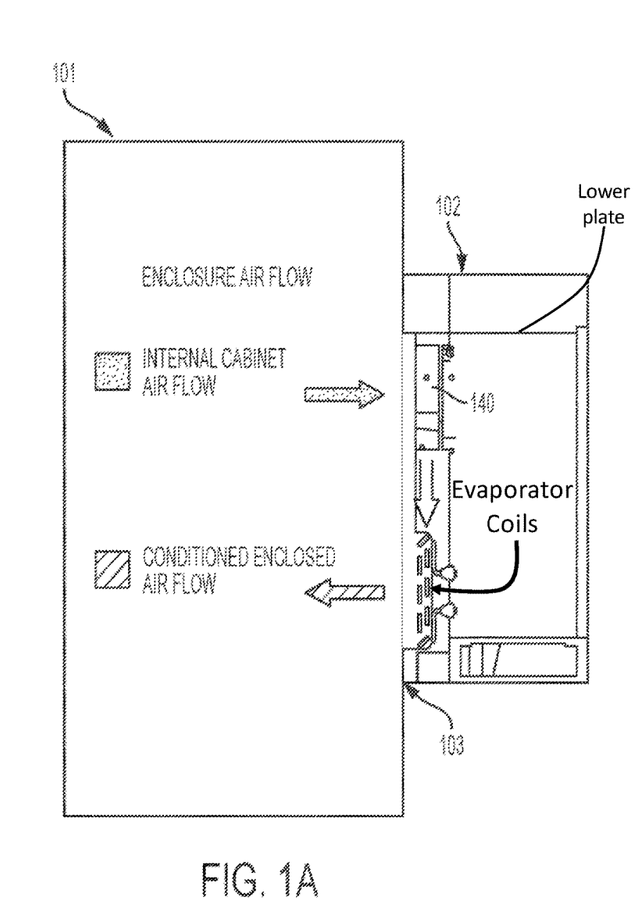

Referring to FIG. 1A, a side view illustrates a closed-loop cooling system that includes an air conditioner 102 that cools heated air of an enclosure 101, which in turn includes heat generating components, e.g., electrical equipment. The air conditioner 102 is attached to the enclosure 101, e.g., at an opening 103. The air conditioner 102 is closed-loop because it includes an enclosure side compartment, illustrated as a rear compartment (left side in FIG. 1A), and an ambient side compartment, illustrated as a front compartment (right side in FIG. 1A). This permits the air conditioner 102 to cool air of the enclosure 101 without mixing the returned, conditioned air with ambient air, which only interfaces with components in the ambient side compartment.

Conventionally, the enclosure side compartment of the air conditioner 102 is purged to ensure that the components of the enclosure side compartment are safe for use in a hazardous environment. For example, a purge system provides pressurized air to the enclosure side compartment, purging out any hazardous air that may envelope the components of the enclosure side compartment. However, because all components of the air conditioner 102 are non-sparking and non-arcing, purging is not required.

Figure 1B:
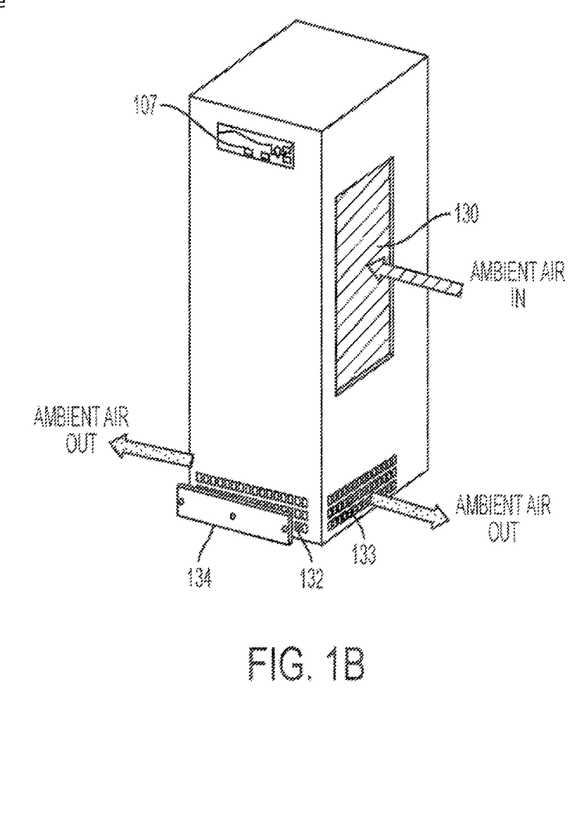

In FIG. 1B, a perspective view of the air conditioner 102 is provided. Here, the front of the air conditioner 102 is illustrated in perspective view, i.e., the front side faces away from the enclosure 103. The ambient airflow is illustrated, where ambient air enters through an air filter 130 that covers an air intake on the right side of the air conditioner 102 (refer to FIG. 4D). The air conditioner 102 includes ambient air outlets or exhausts, two of which are indicated in FIG. 1B at 132, 133, and a diverter plate 134 that may be attached to any of the air outlets or exhausts 132, 133. A digital controller 107 is provided for controlling the air conditioner 102. The digital controller 107 may be located on the front face, as illustrated in FIG. 1B, or another face, e.g., the rear of the air conditioner 102, as further described herein.

Figure 2:
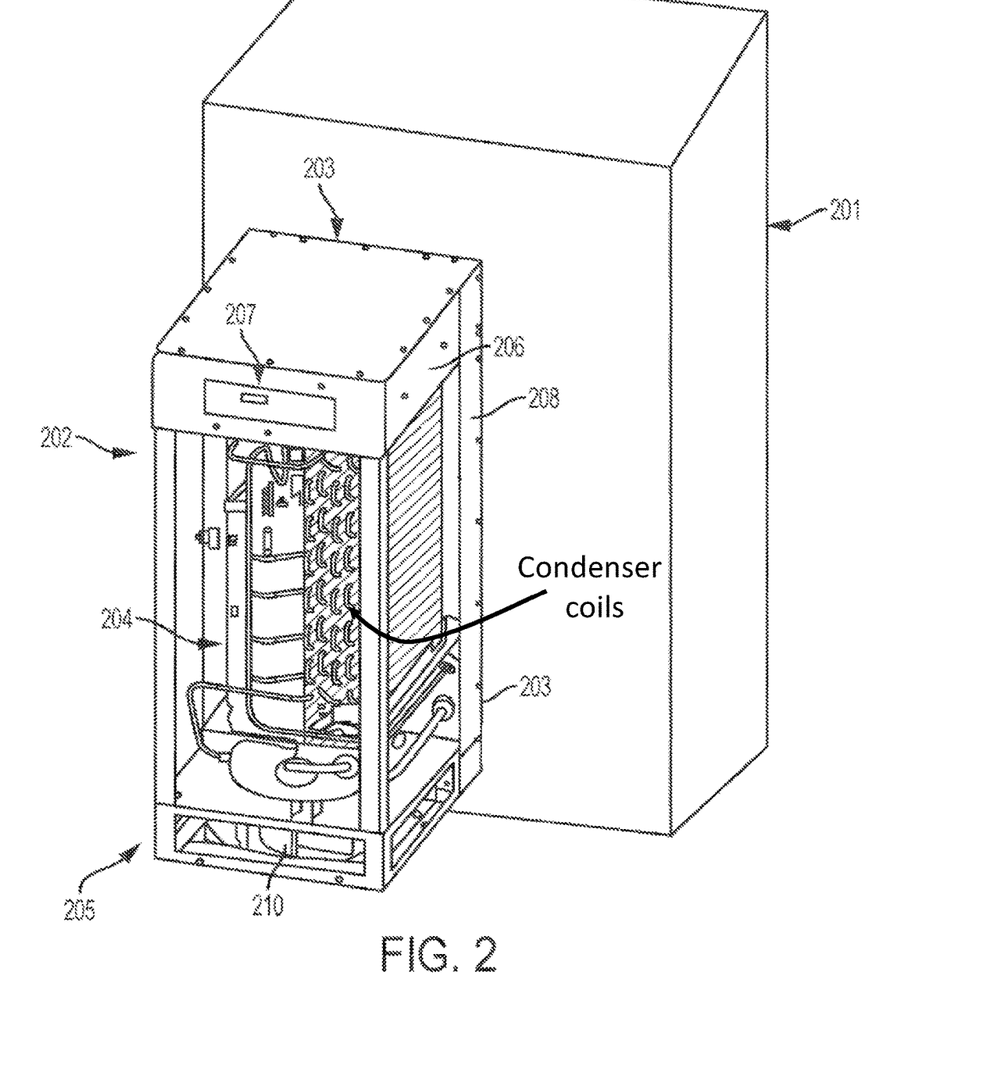
FIG. 2 illustrates an example closed-loop enclosure cooling system according to an embodiment.

Referring to FIG. 2, an embodiment provides an air conditioner 202 that includes non-sparking, non-arcing electronics components in an electrical box exposed to the enclosure air, avoiding the need for a purge system. In the example of FIG. 2, a closed-loop cold air supply stream circulates cold air from the cooling system 202 to an enclosure 201, which is configured to house various heat generating electronic components. In an embodiment, the cooling system 202 includes ambient side compartments and enclosure side compartments, as further described herein.

In the example illustrated in FIG. 2, the air conditioner 202 is generally rectangular in shape and includes a housing that defines various compartments/areas containing functional components. By way of specific example, illustrated is an air conditioner 202 that is sealed to an aperture or opening 203 of an enclosure 201. The air conditioner 202 includes a first ambient side compartment 204 that contains a compressor and condenser coils (the covers of the first compartment 204 have been removed in FIG. 2 for illustration of the components therein).

Figure 4A:
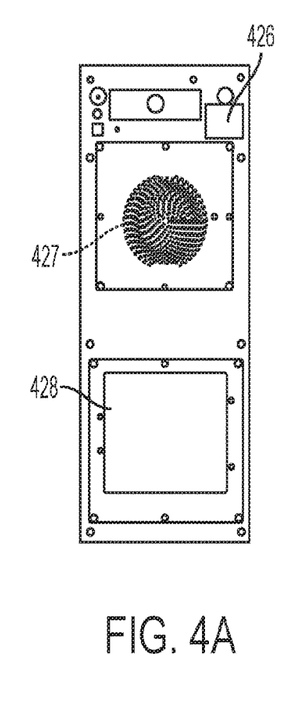
Figure 4B:
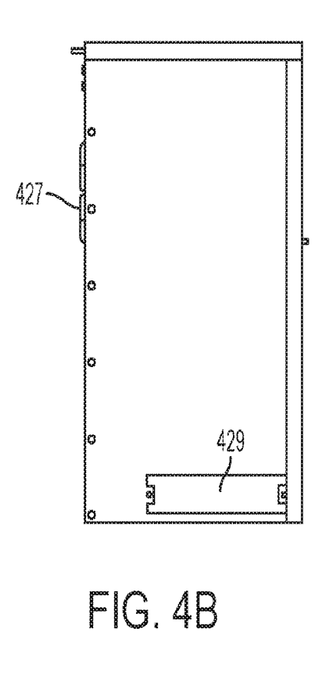
Figure 4C:
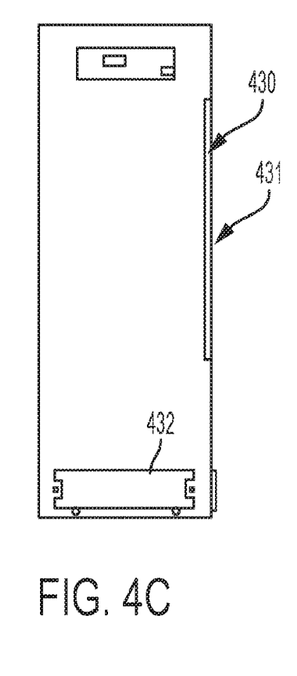
Figure 4D:
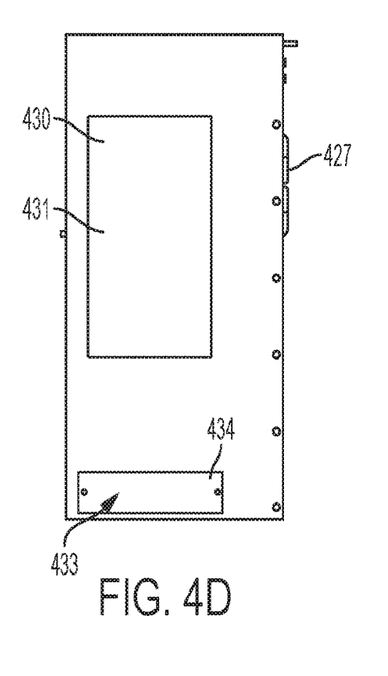

The air conditioner 202 includes a lower ambient side compartment 205 that includes an impeller 210 to draw ambient air into the ambient side compartment 205 (e.g., via air filter 430 and air inlet 431 illustrated in FIG. 4D). FIG. 2 provides for the location of a condenser impeller 210 in the lower section of the condenser compartment 205 of the cooling system 202. This condenser impeller 210 is configured to pull air through a condenser coil to disperse heat throughout the cooling system 202. The ambient air transits out of the air conditioner 202 via ambient air outlets in the lower compartment 205. A compressor of the compartment 204 may be configured for operation in the cooling system 202, acting as a pump that is configured to circulate refrigerant in the closed-loop cooling system 202 between a condenser in compartment 204 and one or more evaporator coils in compartment 208.

The air conditioner 202 further includes a first enclosure side compartment 206 on the upper side of the air conditioner 202. The first enclosure side compartment 206 comprises an electrical box (refer to FIG. 3 for a detailed description of example components that may be included therein). This electrical box is sealed from the ambient air of compartments 204, 205 and provides for easy access to all controls, e.g., via removal of the top plate that encloses the first enclosure side compartment 206 from the ambient air. A digital controller 207 may be attached to the front side of the first enclosure side compartment 206, as illustrated in FIG. 2, or the digital controller 207 may be attached to the rear side of the first enclosure side compartment 206 (not illustrated in FIG. 2).

The air conditioner 202 includes a second or rear enclosure side compartment 208, which is an elongated compartment that extends about the entire length of the rectangular housing of the air conditioner 202 and interfaces with the interior of the enclosure 201. This second enclosure side compartment 208 may communicate with the first enclosure side compartment 206, such that the two compartments 206, 208 form an inverted L shaped or "7" shaped enclosure side compartment, which is sealed off from the ambient side compartments 204, 205. The rear face of the air conditioner 202, i.e., where the second enclosure side compartment 208 interfaces with the enclosure 201, includes an enclosure air intake and return, as further described herein.

As illustrated in FIG. 2, the air conditioner 202 includes condenser coils in compartment 204 that are coupled to the compressor and comprise a plurality of tubes that carry refrigerant. These condenser coils are configured to convert refrigerant in the form of gas or vapor back into liquid form by removing heat. Ambient air enters compartment 204 from a side air inlet (431 illustrated in FIG. 4D) to interact with the condenser coils and ambient air exits from point(s) in compartment 205 (429, 432, 433 illustrated in FIG. 4B-D).

Evaporator coils are located in compartment 208 and carry refrigerant to remove heat from enclosure air as the refrigerant evaporates. Enclosure air is circulated through the evaporator coil in compartment 208 via an evaporator impeller (illustrated at 140 of FIG. 1A) within an enclosure side compartment 208 of the cooling system. The enclosure impeller 140 is provided in a nonincendive manner. Cooled enclosure air may then be returned from compartment 208 to the enclosure 201 through a return (428 illustrated in FIG. 4A).

Figure 3:
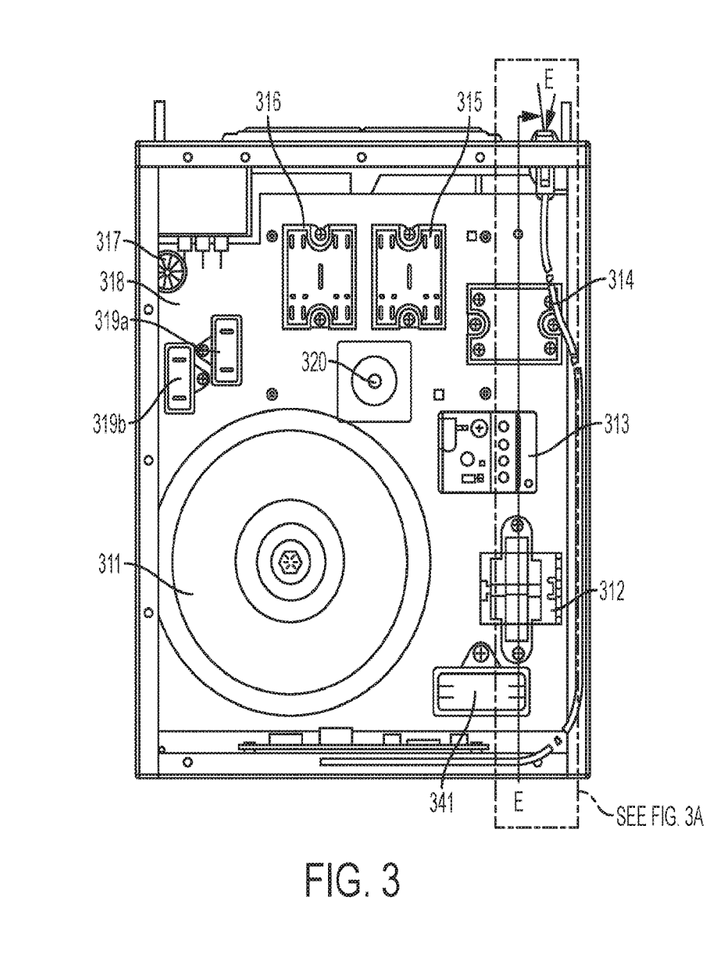
FIG. 3 illustrates a top view of an example closed-loop enclosure cooling unit according to an embodiment.

Referring now to FIG. 3, a top view of air conditioner 202 is illustrated. Here, the first enclosure side compartment (206 of FIG. 2) is illustrated with the top cover or plate removed to reveal example functional components included in the electrical box. As illustrated, the top compartment includes non-sparking, non-arcing components such that these components may be exposed to enclosure air without a need for purging the compartment.

Illustrated in FIG. 3 is an upper plate 318 that secures or supports a variety of components, e.g., a toroidal transformer 311 (which may be sealed or encapsulated), current limiting control transformer 312, a solid-state compressor overload relay 313, a solid-state alarm relay 314, a solid-state condenser fan relay 315, a solid-state compressor relay and evaporator impeller relay 316, an evaporator sensor (routed through bushing 317 and placed in second enclosure side compartment), and encapsulated (e.g., epoxy filled) condenser and evaporator fan run capacitors, 319a, 319b, respectively. Compressor run capacitor 341 may likewise be encapsulated. Each component of the upper or first enclosure side compartment (206 of FIG. 2) is non-sparking, non-arcing and therefore safe for use in a hazardous air environment without a need to purge this or any enclosure compartment of the cooling system. A nonincendive digital controller is also provided (illustrated near the bottom in FIG. 3, although the digital controller may be located at the opposite, enclosure side of the electrical box, as further described herein).

The component parts and connections of the first enclosure side compartment 206 of FIG. 2 are non-sparking, non-arcing, and they do not combust air during normal operation. These component parts include, for example, a compressor solid-state relay 316 operably coupled to the compressor (provided within compartment 204 of FIG. 2) and a condenser fan/N/O alarm solid-state relay 315, which is operably coupled to the condenser or impeller fan to control the functionality of these component parts. The electrical box may also house a sealed compressor run capacitor 341; this compressor run capacitor 341 may be positioned for example in the place of toroidal transformer 311, e.g., for 110V and 120V implementations, and be used to aid the starting of the compressor and the compressor impeller during operation of the cooling system). Other intrinsically-safe or nonincendive components housed in the electrical box may include the compressor overload solid-state relay 313 (or an encapsulated overload), the limit controlling transformer 312, and alarm solid-state relay 314.

Figure 3A:
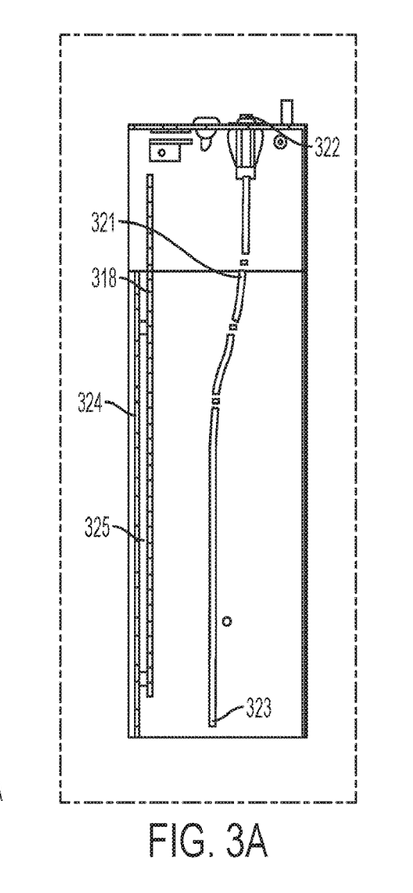
FIG. 3A illustrates a cross sectional view of the example view of FIG. 3.

FIG. 3A illustrates a cross section of the first enclosure side compartment at section E-E of FIG. 3. As shown, the first enclosure compartment (206 in the example of FIG. 2) may include a purge fitting 322 near the rear surface of the air conditioner for a purge tube 321. A purge tube 321 and fitting 322 are not required, as all components are non-sparking, non-arcing, and thus do not require purging, e.g., by conducting of purge air into the first enclosure side compartment via the purge tube 321 and exiting into the compartment via end 323. However, certain enclosure operators may wish to connect the purge fitting 322 to a purge system of the enclosure for internal compliance rules or to purge any air in the enclosure side compartments 206, 208 that may be thought to remain after installation.

As illustrated in FIG. 3A, the upper plate 318 is separated from a lower plate 324 of the first or upper enclosure side compartment. The lower plate 324 supports the upper plate 318 and defines an air gap 325. Air from the enclosure (e.g., 201 of FIG. 2) that is circulated through the enclosure side compartments (e.g., 206, 208 of FIG. 2) circulates over and underneath plate 318, which is an integrated heat sink, and the components supported thereon as the air conditioner operates to circulate enclosure air therethrough. This provides additional air flow and cooling capacity to the components supported by plate 318 and permits operation of the air conditioner unit at higher ambient temperatures. For example, the air conditioner can operate between about −40 C to 60 C ambient temperatures.

FIG. 4 (A-D) illustrates rear, left, front and right-side views, respectively, of the example air conditioner of FIG. 2. By way of illustration, FIG. 4A illustrates the rear side of the air conditioner, i.e., the side that faces the enclosure opening. The rear side includes an enclosure air intake 427 and return 428, through which air is drawn from and returned to the enclosure by an enclosure impeller (140 of FIG. 1). FIG. 4B illustrates a left side view in which the air intake 427 is again visible, as is one of three ambient air exhausts 429. FIG. 4C illustrates a front view in which a digital controller 407 is disposed (on the front of the air conditioner) and a second ambient air exhaust 432 is illustrated. Shown in FIG. 4D are an air filter 430 (e.g., a 10 micron filter) and ambient air inlet 431 (co-located and covered by the air filter 430). In addition, FIG. 4D illustrates an additional, third ambient air exhaust 433 that is covered by a diverter plate 434. The diverter plate 434 is co-located with and covers any of the air exhausts 429, 432 or 434. The diverter plate 434 is optional and can be positioned to direct air flow through the remaining open exhausts selected from 429, 432 or 433.

Figure 5:
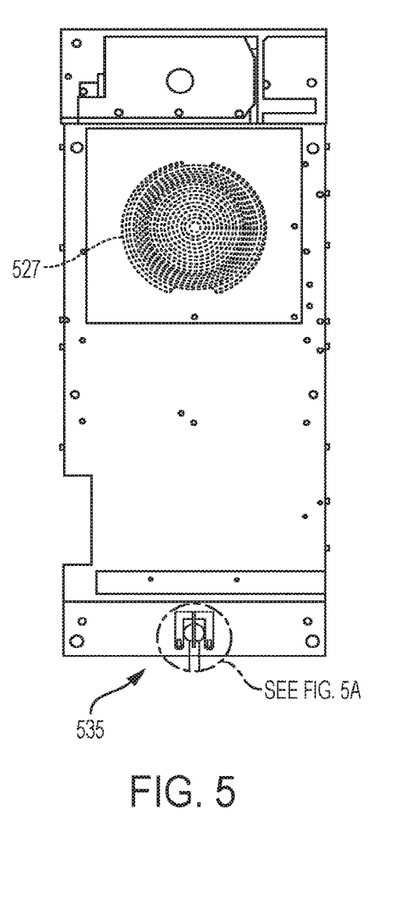
FIG. 5 illustrates a rear view of an example closed-loop enclosure cooling unit according to an embodiment.

In FIG. 5 a rear view of the example air conditioner 202 of FIG. 2 is illustrated in which the interior of the lower side of the second or elongated enclosure side compartment (208 of FIG. 2) is visible. This illustrates the internal drain assembly 535 located behind the evaporator coil of the elongated enclosure side compartment, inside of a drain pan, which permits water to exit out of the lower or second ambient side compartment. FIG. 5 also illustrates the air intake 527 for the enclosure air.

Figure 5A:
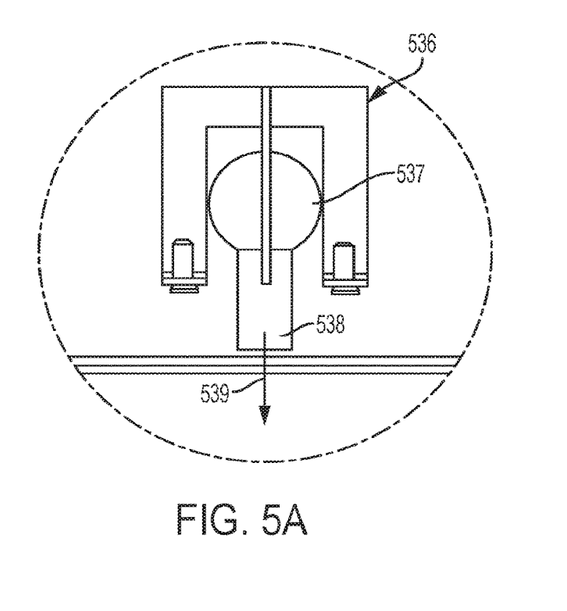
FIG. 5A illustrates a detail view of a drain assembly illustrated in FIG. 5.

The drain assembly 535 of FIG. 5 is illustrated in detail in FIG. 5A. Here, it is illustrated that a trap assembly 536 secures a ball 537 that is contained in the trap assembly 536 and is positioned on a drain tube 538. The ball 537 is buoyant and as water fills the lower part of the second enclosure side compartment drain pan, the ball 537 transits upward, permitting water to exit out the bottom of the conditioner 539 via drain tube 538.

The drain pan holding the drain assembly 535 is configured to collect water that is created as a by-product of the condensation process. In one embodiment, the cooling system is configured with a condensate management system including a float drain. This drain system aids in maintaining the pressure inside a customer's enclosure.

Figure 6:
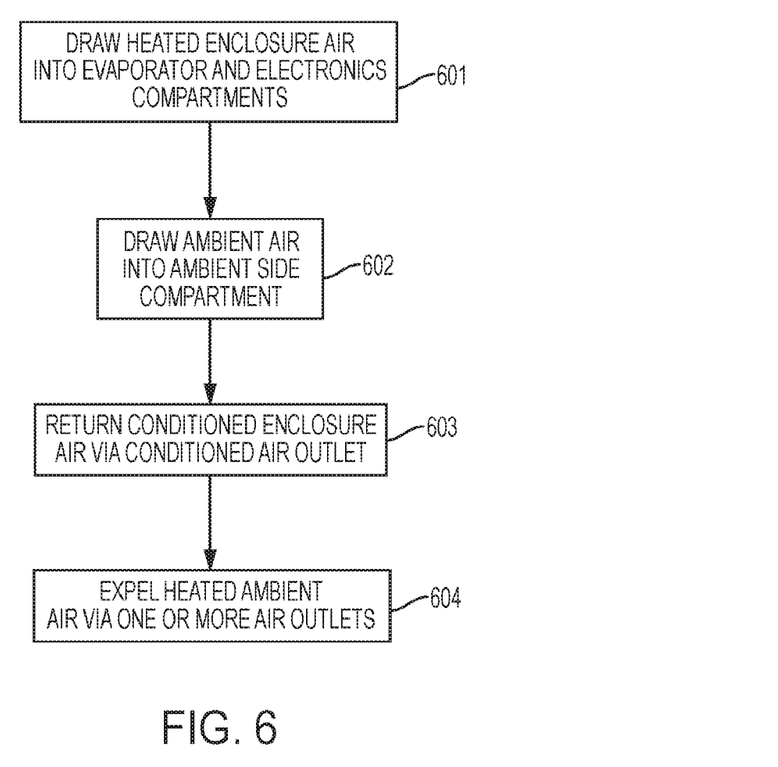
FIG. 6 illustrates an example method according to an embodiment.

An example method is illustrated in FIG. 6. In an embodiment, a method includes attaching a cooling unit to an enclosure opening and drawing heated enclosure air into evaporator and electronics compartments at 601. The cooling unit, e.g., air conditioner, includes a system of components in separate compartments. For example, in the method, the cooling unit is constructed to segregate ambient and enclosure side compartments. The cooling unit is sealed to the enclosure opening, preventing ambient air entry via the enclosure opening. Because the cooling unit ambient and enclosure compartments are segregated, the ambient air of any ambient compartment cannot enter the enclosure. Further, the enclosure compartment(s) of the cooling unit contain only non-sparking, non-arcing components, making the cooling unit safe for use in a hazardous air environment. In an embodiment, the ambient compartment(s) contain only non-sparking, non-arcing components, making the cooling unit safe for use in a hazardous air environment. In an embodiment, all compartments (i.e., the entire unit) contain only non-sparking, non-arcing components, making the cooling unit safe for use in a hazardous air environment.

At 602, ambient air is drawn into an ambient side compartment of the air conditioner. Consequently, at 603 conditioned air is returned to the enclosure via an air outlet of the enclosure side and at 604 heated ambient air is expelled via one or more of the ambient air outlets.

In particular, enclosure air intake and return, e.g., of a rear face of the elongated, rear enclosure side compartment, are arranged to conduct heated air from the enclosure over the cooling coils. This operation includes conducting heated air from the enclosure over components of an electric box, e.g., of an upper enclosure side compartment of the cooling unit having non-sparking, non-arcing components disposed therein. Therefore, the operating includes additional internal cooling of heat generating components of the cooling unit, extending its operational temperature range significantly.

In various embodiments, different, fewer, or additional components may be included. For example, in an embodiment the electrical box of the first enclosure side compartment 206 of FIG. 2 may comprise one or more of an Ethernet connector, an alarm output, as well as power input and connections. The Ethernet connector may be configured for remote communication and monitoring of the cooling system. Other connectors may be included. As described, a digital controller, e.g., controller 107, can be mounted on the front or rear of the air conditioner. For example, the digital controller 107 may be mounted on the rear of the air conditioner 202 to protect it from unwanted operation. In such cases, remote control of the controller 107 may be preferable as manual access may be difficult.

The illustrated example air conditioner electrical box is configured for 480V. However, the present disclosure is not limited to such an embodiment and it is contemplated that other configurations are within the scope of the present disclosure. For example, an embodiment may be configured for 230V operation or for 120V operation.

In an embodiment, the capacity of the air conditioning units is between 1,000 BTU to 20,000 BTU, or more. Therefore, it will be appreciated that even with the relatively small size of the air conditioner, a large cooling capacity is obtained.

It is worth noting that while specific elements are illustrated in the figures, and a particular ordering or organization of elements or steps has been illustrated, these are non-limiting examples. In certain contexts, two or more elements or steps may be combined into an equivalent element or step, an element or step may be split into two or more equivalent elements or steps, or certain elements or steps may be re-ordered or re-organized or omitted as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A cooling unit, comprising:
   a housing configured to attach to an enclosure opening in a sealed manner, wherein the enclosure houses heat generating electrical equipment;
   the housing comprising:
   a first ambient side area comprising a compressor, condensing coils, and an ambient air intake and outlet;
   a first enclosure side area situated above the first ambient side area and comprising an electrical box that includes one or more relays and a digital controller;
   a second enclosure side area extending along the rear side of the housing and communicating with the first enclosure side area, comprising an impeller, an enclosure air intake, an enclosure air return, and evaporator coils in fluid communication with the condensing coils; and a second ambient side area comprising an impeller and one or more hot air exhausts; wherein all components of the cooling unit are non-sparking and non-arcing;

wherein the first and second ambient side areas are sealed off from the first and second enclosure side areas;

wherein the first enclosure side area comprises a first plate onto which one or more components of the electrical box are attached, and wherein the first plate sits atop a second plate that seals the first enclosure side area off from the first ambient side area; and wherein the first and second plates define an air gap into which enclosure air circulates.

2. The cooling unit of claim 1, wherein the housing is about 11 inches in width.

3. The cooling unit of claim 1, comprising a filter positioned to filter air that transits through the ambient air intake.

4. The cooling unit of claim 1, wherein the housing is rectangular in shape.

5. The cooling unit of claim 4, wherein the second enclosure side area extends less than half of the depth of the rectangular housing.

6. The cooling unit of claim 4, wherein the one or more hot air exhausts comprise three hot air exhausts positioned on the front, left and right sides of the rectangular housing.

7. The cooling unit of claim 6, comprising a diverter plate that attaches to any of the three hot air exhausts.

8. The cooling unit of claim 1, wherein the digital controller is disposed within a rear, enclosure facing surface of the housing.

9. The cooling unit of claim 1, wherein the second enclosure side area comprises a water drain therein.

10. The cooling unit of claim 9, wherein the water drain is disposed in a bottom of the housing.

11. The cooling unit of claim 10, comprising a ball and drain tube situated in an assembly.

12. The cooling unit of claim 1, wherein one or more of the components of the electrical box are sealed, nonincendive, or solid state devices.

* * * * *